US007205815B2

(12) United States Patent
Park

(10) Patent No.: US 7,205,815 B2
(45) Date of Patent: Apr. 17, 2007

(54) METHOD AND INTEGRATED CIRCUIT APPARATUS FOR REDUCING SIMULTANEOUSLY SWITCHING OUTPUT

(75) Inventor: Soo-hee Park, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 96 days.

(21) Appl. No.: 10/963,532

(22) Filed: Oct. 14, 2004

(65) Prior Publication Data
US 2005/0110546 A1 May 26, 2005

(30) Foreign Application Priority Data
Nov. 25, 2003 (KR) ........................ 10-2003-0084174

(51) Int. Cl.
*G06F 1/04* (2006.01)
(52) U.S. Cl. ........................................ 327/291; 327/293
(58) Field of Classification Search ........ 327/291–298, 327/202, 203, 206, 211, 212, 218
See application file for complete search history.

(56) References Cited

U.S. PATENT DOCUMENTS 6,943,610 B2 * 9/2005 Saint-Laurent .............. 327/295
7,003,060 B2 * 2/2006 Naka et al. .................. 375/354
7,010,072 B2 * 3/2006 Lee et al. .................... 375/354

FOREIGN PATENT DOCUMENTS

| JP | 60-117819 | 6/1985 |
| JP | 61-008786 | 1/1986 |
| JP | 04-252518 | 9/1992 |
| JP | 06-311000 | 11/1994 |
| JP | 07-022594 | 1/1995 |

\* cited by examiner

*Primary Examiner*—Linh My Nguyen
(74) *Attorney, Agent, or Firm*—Roylance, Abrams, Berdo & Goodman, L.L.P.

(57) ABSTRACT

Provided are a method and apparatus for reducing the number of power ports equipped with an integrated circuit (IC) apparatus by reducing the number of bus outputs that are simultaneously switched, with the use of a master clock signal and a slave clock signal, which is a variation of the master clock signal. The IC apparatus includes a slave clock signal generator, which receives the master clock signal and generates a slave clock signal for controlling simultaneously switching outputs; and a flipflop circuit, which transmits a signal to an external device in synchronization with the slave clock signal.

12 Claims, 3 Drawing Sheets

METHOD AND INTEGRATED CIRCUIT APPARATUS FOR REDUCING SIMULTANEOUSLY SWITCHING OUTPUT

PRIORITY

This application claims the benefit under 35 U.S.C. §119 (a) of Korean Patent Application No. 2003-84174, filed on Nov. 25, 2003, in the Korean Intellectual Property Office, the disclosure of which is incorporated herein by reference in its entirety.

BACKGROUND OF THE INVENTION

1. Field of the Invention

The present invention relates to a method and apparatus for reducing the number of power supply ports of an integrated circuit (IC) apparatus. More particularly, the present invention relates to a method and apparatus for reducing the number of power supply ports of an IC apparatus by reducing the number of bus outputs that are simultaneously switched, with the use of a master clock signal and a slave clock signal, which is a variation of the master clock signal.

2. Description of the Related Art

Recently, as an increasing number of integrated circuits (ICs) are designed in a system-on-chip (SOC) manner, the size of ICs increases. In addition, an increase in the size of ICs results in an increase in the number of power supply ports for such ICs because as the number of buses that switch their respective states at a predetermined moment of time increases, the amount of current increases.

FIG. 1 is a block diagram of a conventional IC apparatus 180 with simultaneously switching output. Referring to FIG. 1, the conventional IC apparatus 180 includes first, second, third, through n-th external device controllers 100, 110, 120, and 130, a multiplexer 140, and a plurality of output buffers 150, 160, and 170.

The first, second, third, and n-th external device controllers 100, 110, 120, and 130 control external devices, such as external memories and analog-to-digital converters, by using control signals, data signals, and address signal lines.

The multiplexer 140 allows the first, second, third, and n-th external device controllers 100, 110, 120, and 130 to share buses in the conventional IC apparatus 180.

The output buffers 150, 160, and 170, which are bi-directional buffers, insulate the conventional IC apparatus 180 from the external devices and compensates for lack of current.

In FIG. 1, the first, second, third, and n-th external device controllers 100, 110, 120, and 130 may simultaneously operate in a given clock cycle because they may share buses together or exist on different levels of bus hierarchy using different buses. An address signal bus port, a control signal bus port, and a data signal bus output port for each of the buses that can operate simultaneously operate in synchronization of an inner bus reference clock frequency.

For example, in a case where in a 32-bit system, a ROM controller and an input/output (I/O) controller share buses, and first and second SDRAM controllers have their own buses, a total of 96 data signals can be simultaneously switched, and thus a total of 96 data ports are necessary. Taking address and control signal ports as well as the data signals into consideration, a total number of output ports that are simultaneously switched increases considerably.

In the prior art, even a 32-bit system with only three independent buses may have a considerable number of output ports that are simultaneously switched. In some cases, all of the output ports of the 32-bit system can be switched at the same time, in which case, the number of power supply ports exponentially increases. In addition, in the case of using a 64-bit system, instead of the 32-bit system, or using a multi-level internal bus structure, the number of output ports that are simultaneously switched can increase more considerably, a package for an IC apparatus can be more difficult to choose, and the price of the IC apparatus can become higher.

SUMMARY OF THE INVENTION

The present invention provides an apparatus and method for reducing the number of power supply ports of an integrated circuit (IC) apparatus by reducing the number of bus outputs that are simultaneously switched, with the use of a master clock signal and a slave clock signal, which is a variation of the master clock signal.

According to an aspect of the present invention, there is provided an integrated circuit (IC) apparatus that comprises a plurality of external device controllers, which operate in synchronization with a master clock signal, and a plurality of buffers, which buffer a plurality of external devices. The IC apparatus includes a slave clock signal generator, which receives the master clock signal and generates a slave clock signal for controlling a simultaneously switching output; and a flipflop circuit, which transmits a signal to an external device in synchronization with the slave clock signal. The flipflop circuit can be a D flipflop circuit. The slave clock signal generator can preferably generate the slave clock signal by inverting the phase of the master clock signal. The slave clock signal generator can preferably generate the slave clock signal by delaying the master clock signal for a predetermined amount of time.

According to another aspect of the present invention, there is provided a method of reducing simultaneously switching output of an IC apparatus that comprises a plurality of external device controllers, which operate in synchronization with a master clock signal, and a plurality of buffers, which buffer a plurality of external devices. The method involves (a) generating a slave clock signal by modifying the master clock signal in a predetermined manner; and (b) modifying signals in synchronization with the master clock signal and the slave clock signal.

In step (a), the slave clock signal can be generated by inverting the phase of the master clock signal. Alternately, the slave clock signal may be generated by delaying the master clock signal for a predetermined amount of time. In step (b), some of the signals that are simultaneously switched at a rising edge of the master clock signal can be switched at a rising edge of the slave clock signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EXEMPLARY EMBODIMENTS

Figure 1:
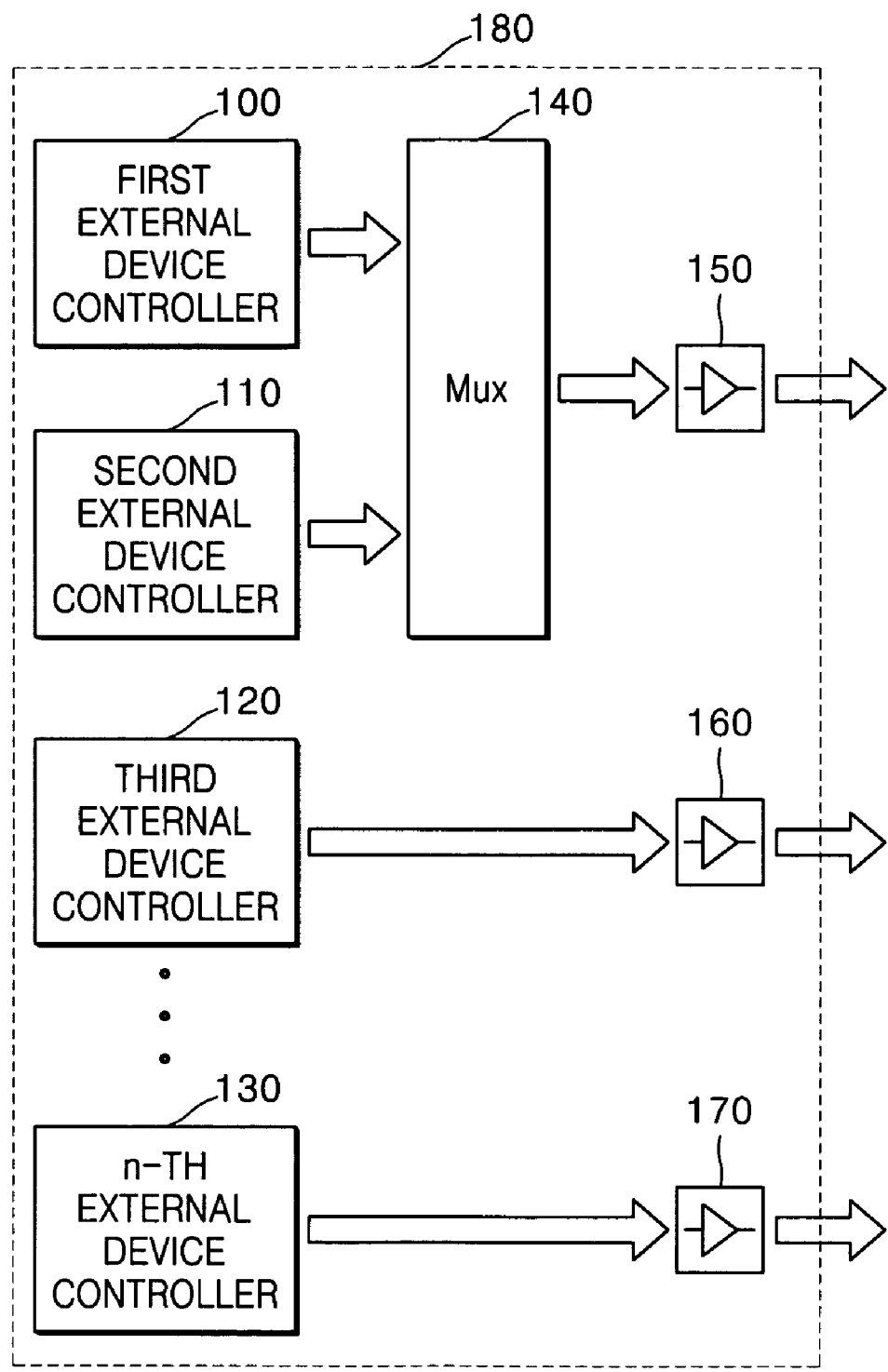
FIG. 1 is a block diagram of a conventional integrated circuit (IC) apparatus with simultaneously switching output.

A method and apparatus for reducing the number of power supply ports of an integrated circuit (IC) apparatus by reducing simultaneously switching output, according to embodiments of the present invention will now be described more fully with reference to the accompanying drawings, in which preferred embodiments of the invention are shown. In the drawings, like reference numerals represent like elements. Various technical features, such as circuits and means for driving them, will be mentioned throughout this disclosure for a better understanding of the present invention. However, it should be apparent to those skilled in the art that the present invention can be embodied in various manners other than those set forth herein without adopting those technical features. Detailed explanations of conventional techniques and structures that are related to the present invention are omitted for conciseness.

Figure 2:
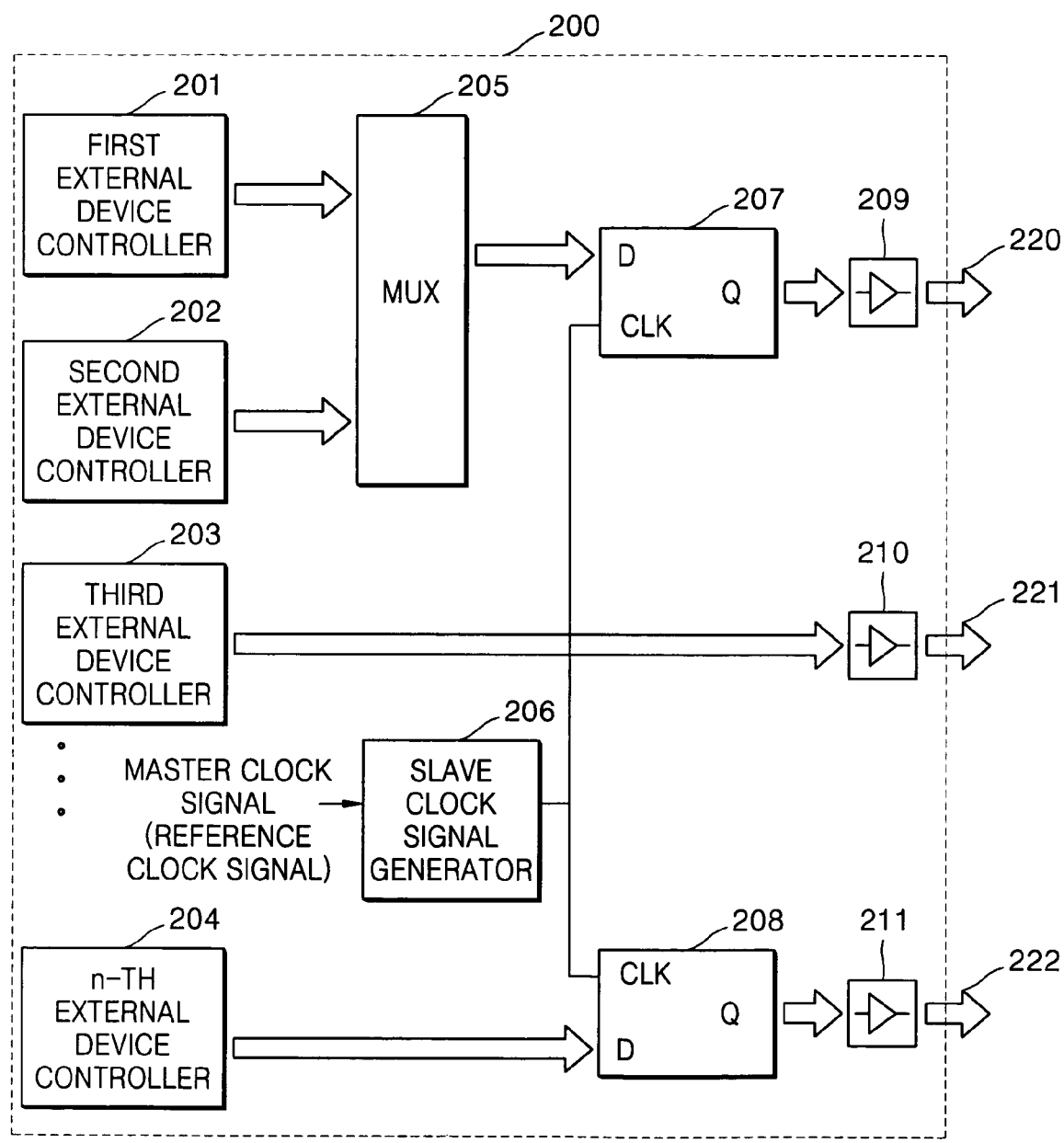
FIG. 2 is a block diagram of an IC apparatus that reduces simultaneously switching output according to a preferred embodiment of the present invention.

FIG. 2 is a block diagram of an IC apparatus 200 that reduces simultaneously switching output, according to a preferred embodiment of the present invention. Referring to FIG. 2, the IC apparatus 200 includes first through n-th external device controllers 201 through 204, a multiplexer 205, a slave clock signal generator 206, flipflops 207 and 208, and a plurality of output buffers 209 through 211.

The first through n-th external device controllers 201 through 204 control external devices, such as external memories and analog-to-digital converters, by using control signals, data signals, and address signal lines.

The multiplexer 205 allows the first through n-th external device controllers 201 through 204 to share buses in the IC apparatus 200.

The output buffers 209 through 211, which are bi-directional buffers, insulate the IC apparatus 200 from the external devices and compensates for lack of current.

Each of the flipflops 207 and 208 transmits a signal input to an input port D thereof at a rising edge of a slave clock signal to an output port Q thereof in synchronization with the slave clock signal. In a preferred embodiment of the present embodiment, the flipflops 207 and 208 are D flip-flops.

The slave clock signal generator 206 receives a reference clock signal and modifies the received reference clock signal by using a predetermined method. In this disclosure, the modified reference clock signal is called a slave clock signal. The slave clock signal generator 206 can modify the received reference clock signal by delaying the received reference clock for a predetermined amount of time, for example, or by inverting the phase of the received reference clock signal with the use of an inverter.

Although FIG. 2 illustrates the reference clock signal only input to the slave clock signal generator 206, the reference clock signal can also be used as an internal reference clock signal that synchronizes the rest of the IC apparatus 200, including the multiplexer 205 and the first through n-th external device controllers 201 through 204, with one another. In this disclosure, the reference clock signal is the same as a master clock signal.

As illustrated in FIG. 2, the first through n-th external device controllers 201 through 204 can share buses together or use different buses, or can exist on different levels of a bus hierarchy. Each of the first through n-th external device controllers 201 through 204 operates in response to the reference clock signal, that is, the master clock signal. However, the number of output ports that are switched at the same edge of the reference clock signal, that is, the master clock signal, can be decreased by disposing the flipflops 207 and 208 between the output buffers 209 through 211 and address, control, and data signals of some of the buses that operate at the same time.

For example, assuming that the first and second external device controllers 201 and 202 are a ROM controller and an input/output (I/O) controller, respectively, the third and n-th external device controllers 203 and 204 are SDRAM controllers, the ROM controller and the I/O controller share an internal bus together, the SDRAM controllers use different buses, and an entire system is a 32-bit system.

Taking into consideration only data signals that are simultaneously switched at external ports 220 through 222, 32 bits of a data signal output from the third external device controller 203 to the external port 221 are switched at a rising edge of the master clock signal, and 32 bits of each data signal output from the first and second external device controllers 201 and 202 to the external port 220 and 32 bits of a data signal output from the n-th external device controller 204 to the external port 222 are switched at a rising edge of the slave clock signal. Therefore, some of the data signals that used to be switched at the rising edge of the master clock edge in the prior art are switched at the rising edge of the slave clock signal, thereby reducing the number of data signals that are simultaneously switched. Accordingly, it is possible to decrease the amount of current and the number of power supply ports equipped with a system-on-chip.

Figure 3:
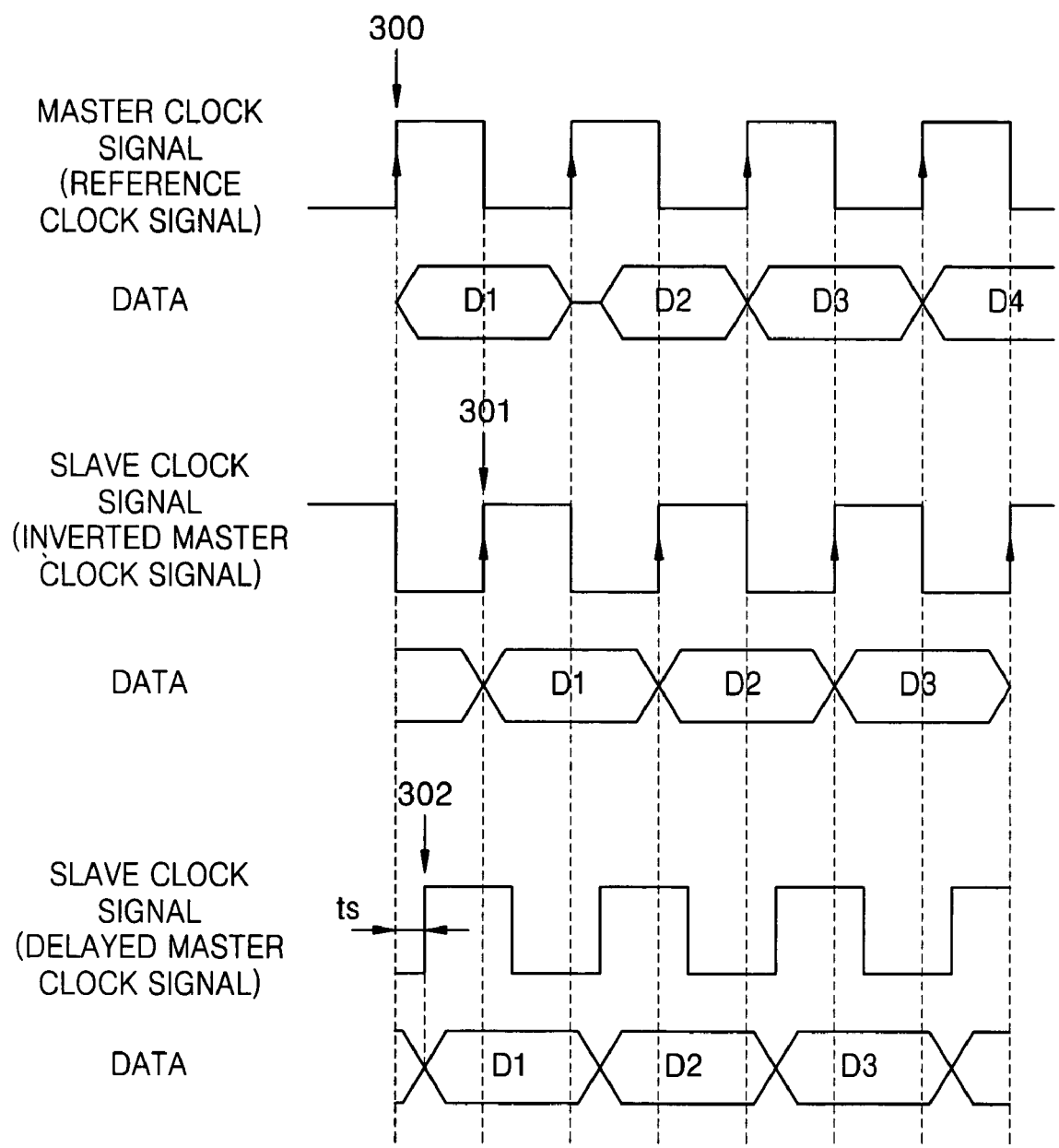
FIG. 3 is a diagram illustrating a master clock signal, different types of slave clock signals, and data synchronized with each of the master clock signal and the different types of slave clock signals.

FIG. 3 is a diagram illustrating a master clock signal, different types of slave clock signals, and data synchronized with each of the master clock signal and the different types of slave clock signals. Referring to FIG. 3, in conventional systems, signals transmitted to external devices are all switched at a rising edge 300 of the master clock signal, and thus a considerable amount of current and many power supply ports are needed.

On the other hand, according to embodiments of the present invention, some of the signals that used to be switched at the rising edge of the master clock signal in conventional devices are instead switched at a rising edge 301 of a slave clock signal obtained, for example, by inverting the phase of the master clock signal or at a rising edge 302 of a slave clock signal obtained by delaying the master clock signal. Therefore, it is possible to reduce the number of power supply ports equipped with a system-on-chip.

As described above, according to embodiments of the present invention, it is possible to reduce the number of power supply ports of an IC apparatus by reducing the number of output ports of buses that are simultaneously switched, with the use of a master clock signal and a slave clock signal, which is a variation of the master clock signal.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. An integrated circuit (IC) apparatus that comprises a plurality of external device controllers, which operate in synchronization with a master clock signal, and a plurality of buffers, which buffer a plurality of external devices, the IC apparatus comprising:

a slave clock signal generator, which receives the master clock signal and generates a slave clock signal for controlling simultaneously switching output; and a flipflop circuit, which transmits a signal to an external device in synchronization with the slave clock signal.

2. The IC apparatus of claim 1, wherein the flipflop circuit comprises a D flipflop circuit.

3. The IC apparatus of claim 1, wherein the slave clock signal generator generates the slave clock signal by inverting the phase of the master clock signal.

4. The IC apparatus of claim 1, wherein the slave clock signal generator generates the slave clock signal by delaying the master clock signal for a predetermined amount of time.

5. A method of reducing simultaneously switching outputs of an IC apparatus that comprises a plurality of external device controllers, which operate in synchronization with a master clock signal, and a plurality of buffers, which buffer a plurality of external devices, the method comprising:
   (a) generating a slave clock signal by modifying the master clock signal in a predetermined manner; and
   (b) modifying at least one output signal in synchronization with the master clock signal and at least one other output signal in synchronization with the slave clock signal.

6. The method of claim 5, wherein in step (a), the slave clock signal is generated by inverting the phase of the master clock signal.

7. The method of claim 5, wherein in step (a), the slave clock signal is generated by delaying the master clock signal for a predetermined amount of time.

8. The method of claim 5, wherein in step (b), the at least one output signal is switched at a rising edge of the master clock signal and the at least one other output signal is switched at a rising edge of the slave clock signal.

9. An integrated circuit apparatus, comprising:
   at least one first device having an output which is transmitted in synchronization with a master clock signal;
   a slave clock signal generator which receives the master clock signal and generates a slave clock signal;
   a flip-flop circuit; and
   at least one second device having an output which is transmitted to the flip-flop circuit,
   wherein the flip-flop circuit has an output which is transmitted in synchronization with the slave clock signal.

10. The IC apparatus of claim 9, wherein the flipflop circuit comprises a D flipflop circuit.

11. The IC apparatus of claim 9, wherein the slave clock signal generator generates the slave clock signal by inverting the phase of the master clock signal.

12. The IC apparatus of claim 9, wherein the slave clock signal generator generates the slave clock signal by delaying the master clock signal for a time period.

* * * * *